(12) United States Patent
Morley et al.

(10) Patent No.: US 6,504,981 B1
(45) Date of Patent: Jan. 7, 2003

(54) STRUCTURED FACEPLATE FOR EMISSIVE DISPLAYS

(75) Inventors: Roland M. Morley, Tempe, AZ (US); Dennis L. Matthies, Princeton, NJ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/948,835

(22) Filed: Sep. 7, 2001

(51) Int. Cl.[7] ................................................. G02B 6/04
(52) U.S. Cl. ........................................ 385/120; 385/901
(58) Field of Search ................................. 385/120, 146, 385/115, 116, 119, 901; 362/385

(56) References Cited

U.S. PATENT DOCUMENTS 5,822,021 A  * 10/1998 Johnson et al. ............. 348/742

* cited by examiner

Primary Examiner—Javaid Nasri
(74) Attorney, Agent, or Firm—Trop, Pruner & Hu, P.C.

(57) ABSTRACT

An emissive display may include a faceplate that improves contrast and increases light efficiency in some embodiments. The emissive display may be covered by a plurality of cones that define light pipes between the cones. The cones may be reflective on one surface to reflect outwardly through a microlens. The inside surfaces of the cones may be light absorbing to absorb stray light that would not otherwise be properly emitted from the display.

14 Claims, 2 Drawing Sheets

STRUCTURED FACEPLATE FOR EMISSIVE DISPLAYS

BACKGROUND

This invention relates generally to emissive, flat panel displays including displays using organic light emitting devices and other light emitting devices.

Emissive displays emit light that may be perceived by the user. Organic light emitting devices may use polymers or so-called small molecules. These materials may economically produce tri-color displays.

In many cases, the light emitting displays are modular or formed from a plurality of tiles. The tiles may be abutted side-by-side into an array. Each tile may produce a portion of an overall displayed image that results when all of the images from the constituent tiles are viewed in combination. In many cases, the tiled displays are more economically fabricated and are easier to transport.

The light efficiency of the emissive displays may be lower than with other displays. Of course, the amount of light that any given display produces may be increased by driving the display with more current. However, this may adversely affect the lifetime of the display. Therefore, it is most desirable to obtain the greatest possible external light efficiency for a given drive current from a given emissive display.

Especially with tiled displays, it may be important to increase the contrast between light emitting and non-light emitting regions. Moreover, because the tiles abut one against the other, there may be non-light producing areas between adjacent tiles. Thus, it may be important in some cases to blend the regions between emitting display areas into the overall displayed image.

Thus, there is a need for better ways to build a emissive displays.

DETAILED DESCRIPTION

Figure 1:
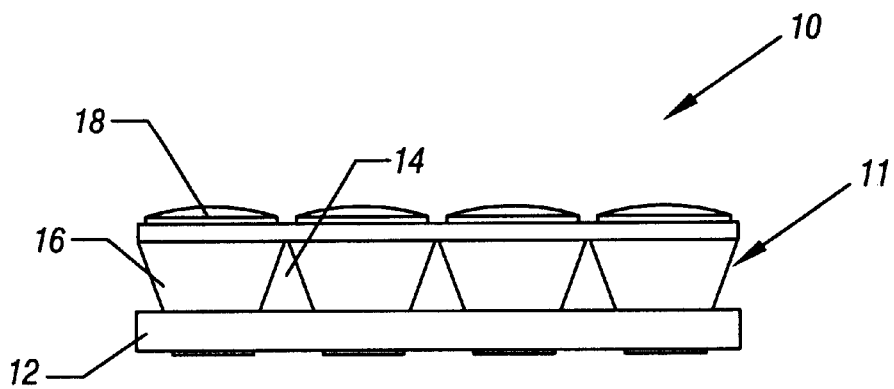
FIG. 1 is a cross-sectional view in accordance with one embodiment of the present invention.

Referring to FIG. 1, a display 10 includes a faceplate 11 and an emissive display panel 12 having a plurality of subpixels that emit light. The faceplate 11 includes a light pipe 16 arranged over each light emitting subpixel. The light pipe 16 may be defined between adjacent cones 14 in one embodiment of the present invention. In one embodiment of the present invention, each cone 14 may have a reflective side. The tapered reflective sides of opposed cones 14 serve to pipe light upwardly and away from the display panel 12.

Across the top of the light pipe 16 is a microlens array 18. The microlens array 18 further serves to improve the efficiency of the display 10 in some embodiments. By using convex sections for the microlens array 18 in one embodiment, glare may be reduced, while improving the distribution of light from the display panel 12 to the viewer.

Figure 2:
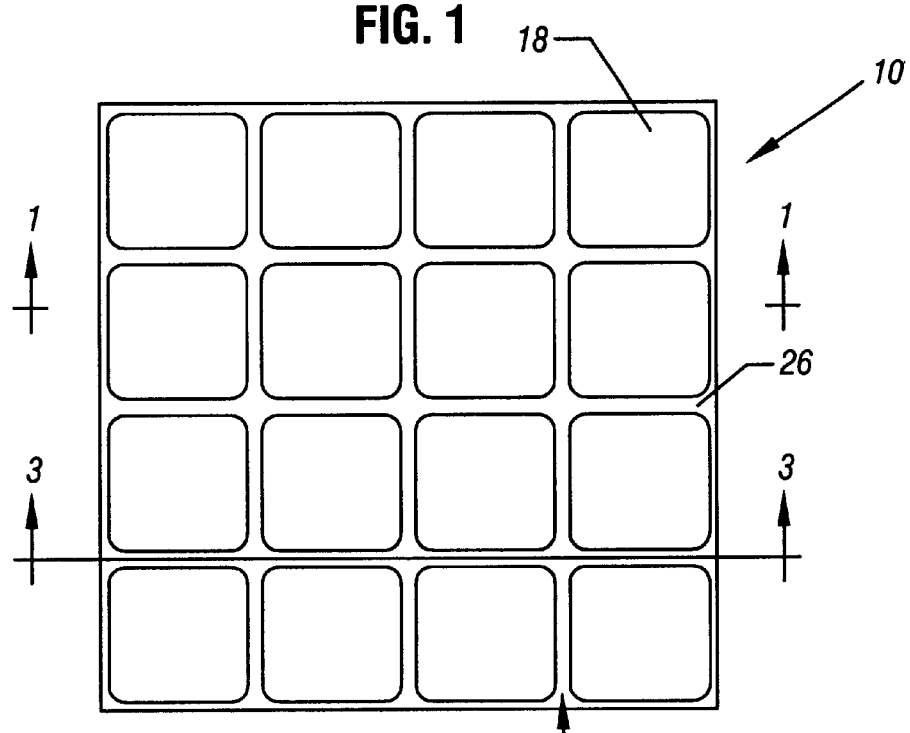
FIG. 2 is a top plan view corresponding to the embodiment shown in FIG. 1 in accordance with one embodiment of the present invention.

Referring to FIG. 2, a display 10 made up of an array of subpixels may include a plurality of microlenses in an array 18. In one embodiment, the display 10 may be a tile in a tiled display. While a 4×4 pixel display 10 is illustrated, in some embodiments, a large number of pixels may be utilized. For example, pixels with 40×40 pixels are conventional.

Figure 3:
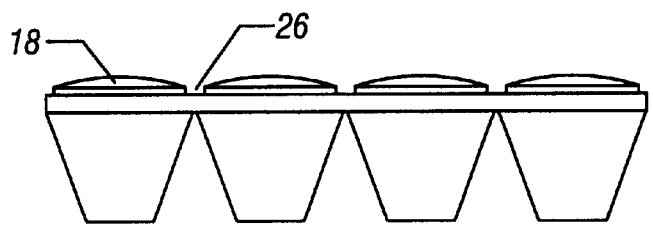
FIG. 3 is a cross-sectional view taken generally along the line 3—3 in FIG. 2 in accordance with one embodiment of the present invention.

Referring to FIGS. 2 and 3, an inter-pixel region 26 exists between the pixels indicated by microlenses in the array 18. The inter-pixel regions 26 may be depressed as indicated in FIG. 3 in one embodiment of the present invention. The surfaces of the regions 26 may be roughened to improve contrast relative to the pixel regions in some embodiments. Thus, the non-light producing inter-pixel regions 26 may be optically absorbing relative to the light emissive regions represented by the microlenses in the array 18. Alternatively, a light absorptive coating may cover the regions 26. In some embodiments, the regions 26 may also be black-colored to reduce reflections from these non-light producing regions.

Figure 4:
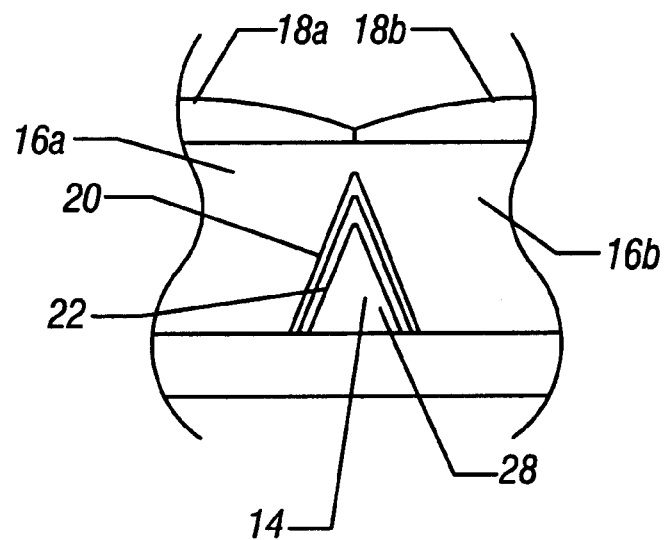
FIG. 4 is an enlarged cross-sectional view of a portion of the embodiment shown in FIG. 1 in accordance with one embodiment of the present invention.

Referring to FIG. 4, the cones 14 may include an index matching material 28 that absorbs any light that unintentionally shines upwardly into the cone 14. The inwardly facing surface 22 of each cone 14 may be black colored when viewed from the interior of the cone 14. The inwardly facing surface 22 traps light inside the cones 14. This improves display contrast by reducing stray light within the panel 12.

On the exteriorly facing side of the cones 14 there may be a reflective coating 20 in accordance with one embodiment of the present invention. The air interfaces at the tapered sides of each of the cones 14 act as light pipes to redirect light that would not otherwise be able to exit from the display 10. The light redirecting optics are not determined by total internal reflection constraints, and there is a wide choice of materials that may be present between the tapered cones.

Figure 5:
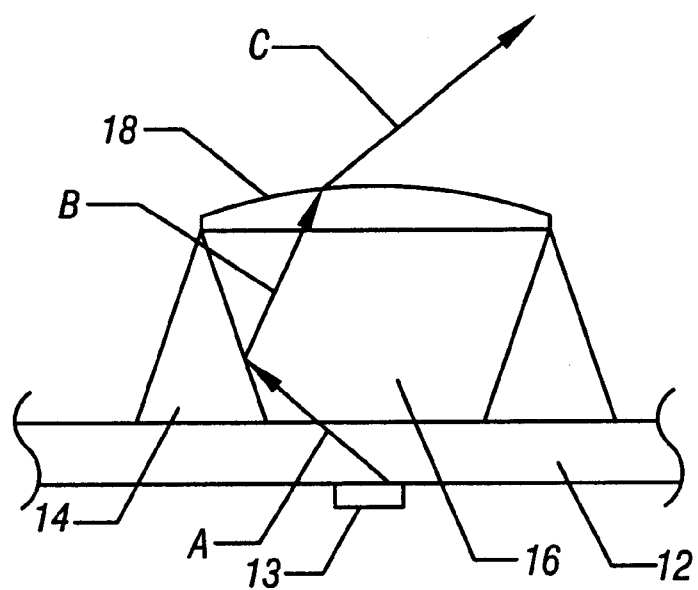
FIG. 5 is an enlarged, schematic cross-sectional view in accordance with one embodiment of the present invention.

Referring to FIG. 5, light produced by an emissive region 13 may extend upwardly as indicated by the arrow A and be reflected from the cone 14 as indicated by the arrow B. The light continuing through the microlens array 18 may be redirected as indicated at C to further concentrate the exiting light towards the viewer.

The faceplate 11 may be formed of plastic in accordance with one embodiment of the present invention. Polycarbonate or other high index plastics enhance the efficiency of the glass/plastic boundary while providing sufficient mechanical ruggedness. Each faceplate 11 may be fabricated to fit one 40×40 pixel modular tile on a 3 mm. pitch in one embodiment. At the edges of the faceplate 11, the inter-pixel regions may be removed making the entire tile 119.7 mm. square in one embodiment. This embodiment may facilitate the assembly of large displays formed from arrays of individual tiles. The gaps left between adjacent tiles may be left unfilled, may be filled with a black adhesive material, or may be filled with a compressible gasket material prior to assembly. The boundaries may have interlocking edge contours, in some embodiments, to interlock with identical adjacent tiles. Alternatively, an interlocking feature may be applied to a small number of display modules to form an integrated super modular structure suitable for assembly into a video wall.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming an emissive display; and providing a faceplate over said display including a microlens array and a structure that defines light pipes between said emissive display and said microlens display, said light pipes using a plurality of spaced apart conical portions having reflective exterior surfaces.

2. The method of claim 1 including forming an organic light emitting device display.

3. The method of claim 2 including molding said faceplate from plastic.

4. The method of claim 1 including providing said microlens array with a plurality of convex lens elements.

5. The method of claim 1 wherein said conical portions have an absorbing interior surface.

6. An emissive display comprising:

a display panel including emissive elements; and a faceplate over said panel including a microlens array and a structure that defines light pipes between said panel and said microlens array, said light pipes defined by a plurality of spaced apart conical portions having reflective exterior surfaces.

7. The display of claim 6 wherein said emissive elements are organic light emitting devices.

8. The display of claim 6 wherein said faceplate is formed of molded plastic.

9. The display of claim 6 wherein said microlens array includes a plurality of hemispherical lens elements.

10. The display of claim 6 wherein said conical portions have light absorbing interior surfaces.

11. An emissive display comprising:

a display panel including emissive elements; and a faceplate over said panel including a microlens array, said microlens array including a plurality of microlens elements each positioned over an emissive element, said faceplate including a structure that defines light pipes between said panel and said microlens array, including a plurality of spaced apart conical portions wherein said conical portions have reflective exterior surfaces.

12. The display of claim 11 wherein said emissive elements are organic light emitting devices.

13. The display of claim 11 wherein said faceplate is formed of molded plastic.

14. The display of claim 11 wherein said conical portions have light absorbing interior surfaces.

* * * * *